United States Patent [19]

Nakata et al.

[11] 4,142,115
[45] Feb. 27, 1979

[54] SEMICONDUCTOR DEVICE WITH A THERMAL PROTECTIVE DEVICE

[75] Inventors: Josuke Nakata; Tohru Kameda, both of Itami, Japan

[73] Assignee: Mitsubishi Denki Kabushiki Kaisha, Tokyo, Japan

[21] Appl. No.: 748,972

[22] Filed: Dec. 9, 1976

[30] Foreign Application Priority Data

Dec. 12, 1975 [JP] Japan .................................. 50-148854

[51] Int. Cl.² .......................................... H03K 17/00
[52] U.S. Cl. ..................................... 307/315; 307/303; 307/310; 361/103; 357/28
[58] Field of Search ........... 307/315, 310, 303, 200 A; 361/103; 357/28

[56] References Cited

U.S. PATENT DOCUMENTS

| | | | |
|---|---|---|---|
| 3,558,987 | 1/1971 | Lewis | 361/103 |
| 3,590,339 | 6/1971 | Bilo | 307/315 |
| 3,694,670 | 9/1972 | Marzolf | 307/315 |
| 4,050,083 | 9/1977 | Jaskolski et al. | 361/103 |

OTHER PUBLICATIONS

IBM Tech. Dislre. Blltn, High Speed D.C. Circuit Breaker, by Melnyk, vol. 12, No. 4, 9/69.

Primary Examiner—Stanley D. Miller, Jr.
Assistant Examiner—B. P. Davis
Attorney, Agent, or Firm—J. B. Hinson

[57] ABSTRACT

This invention relates to a semiconductor device having as a part thereof a second semiconductor device to protect the first or main device against overheating and current overloads.

9 Claims, 4 Drawing Figures

U.S. Patent   Feb. 27, 1979   4,142,115

SEMICONDUCTOR DEVICE WITH A THERMAL PROTECTIVE DEVICE

BACKGROUND OF THE INVENTION

1. Field of the Invention

This invention is in the general field of semiconductor devices and more particularly in the field of protection of semiconductor devices from thermal and current overloads.

2. Description of the Prior Art

Semiconductor devices in general, and power transistors in particular, are subject to high load currents which require the device to normally operate at or near their permissible junction temperature.

All too often, while operating at or near the permissible junction temperature, the device will be subjected to a rapid increase in load current which causes the junction temperature to rapidly increase above the permissible temperature resulting in thermal deterioration or destruction of the device.

As one method of solving the above-mentioned problem, there has been previously proposed the disposing of either a negative temperature characteristic (NTC) thermistor or a positive temperature characteristic (PTC) thermistor in the vicinity of a body of semiconductor material that is the main component of the transistor.

When the negative temperature characteristic thermistor is used, the base current through the transistor can be shunted to the emitter side thereof through the utilization of a change in its resistance due to a temperature rise. Alternatively where the positive temperature characteristic thermistor is used the PTC thermistor may be serially connected to the base of the transistor to suppress the base current through the transistor.

There has also been proposed a method wherein a thermally sensitive diode is connected between an emitter and a base of a transistor to be protected from overheating, so as to be put electrically in parallel to an emitter junction of the transistor. By utilizing a decrease in forward impedance of the diode due to a rise in temperature, the base current through the transistor is shunted to the emitter side of the transistor when the transistor has risen in temperature whereby an increase in collector current is suppressed.

In the prior art methods described above, a thermistor or a thermally sensitive diode is used as a thermally sensitive element. These thermally sensitive elements have their impedances slowly varied with their increased temperature and the change is usually insufficient to help when it is finally realized. Therefore in view of their performance, the prior art thermally sensitive elements, thermistors and diodes are not satisfactory in many cases in that, when a transistor has a temperature sufficiently less than its permissible junction temperature, current amplification factor is lowered, alternatively, even at excessively high temperatures, the collector current of the transistor to be protected cannot be sufficiently reduced and it is impossible to ensure in all cases that the temperature of the transistor will be prevented from rising beyond its permissible junction temperature.

SUMMARY OF THE INVENTION

A semiconductor device comprising: (1) at least a first and a second transistor within a single body of semiconductor material, each of said first and second transistors having an independent emitter and an independent base region and a common collector region, the base region of said first transistor being electrically connected to the emitter region of said second transistor and the emitter region of said first transistor being electrically connected to the base region of said second transistor, and (2) a semiconductor thermally sensitive switching device, said switching device comprising at least four regions of alternate type semiconductivity, said switching device being electrically connected in a series circuit relationship between the base region of said first transistor and the emitter region of said second transistor, said switching device being thermally and physically connected to said second transistor, said switching device changing from a high impedance state to a low impedance state when sensing said second transistor reaching a predetermined temperature, said switching device being adapted to be conducting when said second transistor reaches its junction temperature.

DESCRIPTION OF THE DRAWINGS

For a better understanding of the nature of the present invention, reference should be had to the following detailed description and drawings, in which.

DESCRIPTION OF THE PREFERRED EMBODIMENT

Figure 1:
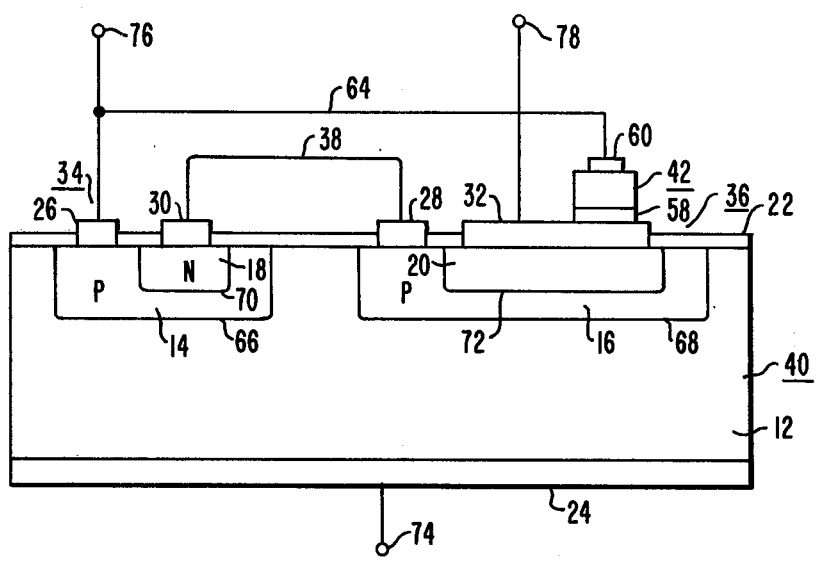
FIG. 1 is a longitudinal sectional view of a semiconductor device illustrating one embodiment of the present invention.

With reference to FIG. 1, there is shown a longitudinal sectional view of a semiconductor device 10 illustrating one embodiment of the present invention.

In FIG. 1, an N conductivity type substrate forms a common collector region for first and second NPN transistors, 34 and 36. First and second P conductivity type regions, 14 and 16, respectively form the base region of the first and second transistors, 34 and 36. First and second N conductivity type regions, 18 and 20, respectively serve at the emitter regions of the first and second transistors, 34 and 36. A silicon oxide film 22 passivates collector junctions 66 and 68 and emitter junctions, 70 and 72. A collector electrode (24) is in ohmic contact with the common collector region (12) of the first and second transistors, 34 and 36. First and second base electrodes 26 and 28 are in ohmic contact with the first and second base regions (14) and (16). First and a second emitter electrodes, 30 and 32, are in ohmic contact with the first and second emitter regions (18) and (20). The first NPN transistor (34), in this embodiment a driving transistor, is formed by the common collector region (12), the first base region (14), the first emitter region (18), the collector electrode (24), the first base region (26) and the first emitter electrode (30) while the second NPN transistor (36) is an output transistor formed by the common collector region (12), the second base region (16), the second emitter region (20), the collector electrode (24), the second base electrode (28) and the second emitter electrode (32). In order to utilize an emitter current from the first or driving transistor (34) as a base current to the second or output transistor (36), the first emitter electrode (30) and the second base electrode (28) are electrically interconnected through an electrical lead (38). Thereby a Darlington transistor (40) is formed within a single body of semiconductor material. The Darlington transistor 40 has a monolithic structure in which the transistors (34) and (36) have a common collector region (12). A semiconductor thermally sensitive switching element (42) of PNPN four layer structure, which is called hereinafter a thermally sensitive element is thermally and physically coupled to the second or output NPN transistor (36).

Figure 2:
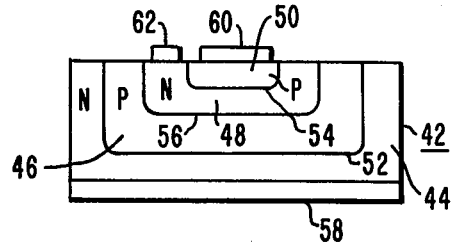
FIG. 2 is a longitudinal sectional view illustrating one example of a semiconductor thermally sensitive switching element suitable for use in accordance with the teachings of this invention.

The structure of the semiconductor switching device 42 is shown in FIG. 2.

With reference to FIG. 2, the semiconductor thermally sensitive switching device 42 is comprised of an N type emitter region (44), a P type base region 46, an N type base region 48, and a P type emitter region 50. These regions may be formed in a silicon substrate as by a selective diffusion technique or by epitaxial growth techniques. The thermally sensitive switching device 42 includes a cathode emitter junction (52), a forward blocking junction (56) and an anode emitter junction (52). A cathode electrode 58, an anode electrode 60 and an N gate electrode 62 are in ohmic electrical contact with the N type emitter cathode region (44), the P type anode emitter region (50) and the N type base region (48) respectively.

As shown in FIG. 1, the thermally sensitive element (42) thus formed has the cathode electrode (58) thermally and physically coupled and electrically connected to the emitter electrode (32) of the second or output transistor (36). The anode electrode (60) is electrically connected to the base electrode (26) of the first or driving transistor (34) by means of an electrical lead (64).

Further, in FIG. 1, the transistors 34 and 36 include collector junctions 66 and 68 and emitter junctions 70, 72. In FIG. 1 the Darlington transistor (40) includes collector, base and emitter terminals, 74, 76 and 78. The collector, base and emitter terminals, 74, 76 and 78 or the Darlington transistor (40) are respectively coupled to the collector electrode (24), the first base electrode (26) and the second emitter electrode (32).

The operation of the thermally sensitive switching device 42 will now be described with reference to FIGS. 3 and 4.

Figure 3:
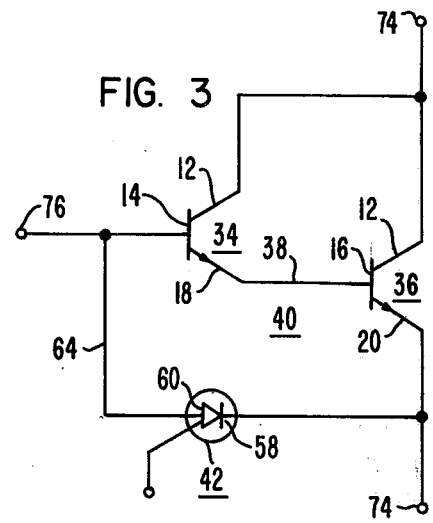
FIG. 3 is a schematic circuit diagram of an equivalent circuit to the structure of FIG. 1.

With reference to FIG. 3, wherein identical reference numerals designate the components identical or corresponding to those shown in FIG. 1, there is shown an equivalent electrical circuit to FIG. 1. Particularly it is to be noted here that while the Darlington transistor (40) and the thermally sensitive element (42) are electrically interconnected as shown in FIG. 3, the two are thermally and physically coupled to each other so that a temperature rise of the Darlington transistor (40) due to its power consumption is quickly transferred to the thermally sensitive switching element (42) through the emitter electrode (32) of the output transistor (36).

Like an ordinary thyristor, the thermally sensitive switching element (42) has an electrical characteristic such that, when a forward voltage is applied thereto so as to render its anode electrode (60) positive and its cathode electrode (58) negative, it is held in its OFF state up to a relatively high voltage within a range of sufficiently low temperature and upon the application of a voltage in excess of that voltage, the element (42) switches from its OFF state to its ON state. Further, the thermally sensitive switching element (42) has the electrical characteristic that the voltage at which it switches from its OFF to its ON state, which voltage is called usually a breakover voltage, is abruptly reduced when a certain temperature is exceeded. That is, the thermally sensitive switching element (42) has the characteristic that, upon a predetermined temperature being reached, it abruptly changes from its high impedance state to its low impedance state resulting in a discontinuous change in impedance 114 the order of from $10^6$ to $10^7$. The thermally sensitive switching element (42) is so made that switching from the OFF state to the ON state is effected at said predetermined temperature and predetermined applied voltage.

In order to prevent the Darlington transistor (40) from reaching a temperature in excess of the permissible junction temperature (Tj) due to electric power consumed by the transistor 40, the arrangement shown in FIG. 1 has the Darlington thermally sensitive element (42) selected such that the thermally sensitive switching element (42) switches from its OFF to its ON state at a temperature very minutely less than the permissible junction temperature (Tj) and with a voltage applied across the base terminal (76) and the emitter terminal (78) of the Darlington transistor (40) to substantially cut off the base current to the Darlington transistor (40).

Figure 4:
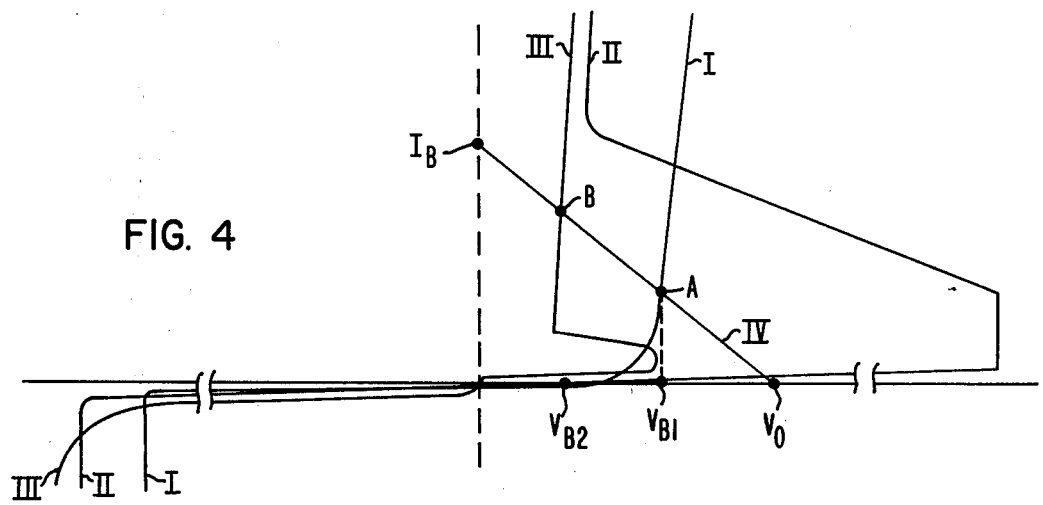
FIG. 4 is a diagram of the voltage-current characteristic of the device of FIG. 1.

FIG. 4 will be referred to to explain the automatic protection of the Darlington transistor (40) against overheating or overcurrents by means of the thermally sensitive element (42) selected as described above and to show the voltage-current electrical characteristics by expressing a voltage (V) across the base terminal (76) and the emitter terminal (78) of the Darlington transistor (40) along the axis of the abscissa and a base-to-emitter current through the Darlington transistor (40) and a current I through the thermally sensitive element (42) along the axis of ordinates. In the FIG. 4, line I is the voltage ($V_{BE}$) current ($I_{BE}$) characteristic between the base and emitter of the Darlington transistor (40) without the thermally sensitive element (42). That characteristic is equal to the voltage-current characteristic of two emitter junctions (70) and (72) serially connected to each other. Line II is the voltage-current characteristic between the anode (60) and the cathode (58) of the thermally sensitive element (42) at a temperature sufficiently less than the permissible junction temperature (Tj) of the Darlington transistor (40). Line III is the voltage-current characteristic between the anode (60) and the cathode (58) of the thermally sensitive element (42) at a temperature very minutely less (on the order of from 1° to 5° C.) than said permissible junction temperature (Tj). Line IV is a load line interconnecting a base voltage (V) applied across the base terminal (76) and the emitter terminal (78) in the open position and a base current ($I_B$) in the closed position.

Where the Darlington transistor (40) has its temperature sufficiently less than its permissible junction temperature (Tj), the thermally sensitive switching element (42) exhibits the voltage-current characteristic such as shown at line III in FIG. 4. Thus the element is held in its OFF state with a base voltage ($V_{B1}$) applied thereto, to cause a flow of very minute current (on the order of 0.1 μA at 50° C.) therethrough and substantial non-conducting. Accordingly, in such a state, a current flowing into the base of the Darlington transistor (40) corresponds to a point A where line I intersects line IV, and the operation is similar to that performed without the thermally sensitive thyristor (42). Thus the current amplification factor is not reduced.

On the other hand, a great decrease in impedance on the load side of the Darlington transistor (40) causes a flow of excessive collector current through the Darlington transistor (40) thereby raising its temperature to approach the permissible junction temperature (Tj). This is attended with a rapid rise in temperature of the thermally sensitive thyristor (42) disposed on the second emitter electrode (32) of the Darlington transistor (40). Thus its voltage-current characteristic shifts from line II to line III. As a result, the breakover voltage of the thermally sensitive thyristor (42) becomes less than the voltage ($V_{B1}$) across the base and emitter. Therefore the thermally sensitive thyristor (42) switches from its OFF state to its ON state and a current at point B where line III intersects line IV flows through the thermally sensitive thyristor (42). Accordingly, the base current to the Darlington transistor (40) is substantially bypassed to the side of the second emitter electrode (32) through the thermally sensitive thyristor (42), so that a load current, that is the collector current is cut off. Then since the temperature of the Darlington transistor (40) is raised due to its thermal inertia and thereafter is lowered, the Darlington transistor (40) is protected without the temperature rising beyond its permissible junction temperature.

When the temperature of the Darlington transistor (40) is lowered, the temperature of the thermally sensitive thyristor (42) is also lowered. Thus if its temperature becomes equal to or less than the predetermined temperature at which the change from the OFF state to the ON state is effected then the thermally sensitive thyristor (42) is again returned back to its OFF state resulting in a flow of base current through the Darlington transistor (40) to supply an electric power to the load. At that time if the load current is excessively high and the temperature of the Darlington transistor (40) again approaches its permissible junction temperature (Tj) then the operation as described above is repeated to stop a rise in temperature leading to the automatic protection against overheating.

Where the temperature of the Darlington transistor (40) being operated tends to exceed its permissible junction temperature (Tj) due to a rise in surrounding temperature, in addition to a rise in temperature due to the over current as above described, the thermally sensitive thyristor (42) can switch at the predetermined temperature to quickly cut off a collector current thereby protecting the Darlington transistor (40).

Now in the embodiment as above described, the thermally sensitive thyristor (42) is connected across and thermally and physically coupled to the base terminal (76) and the emitter terminal (78) of the Darlington transistor (40) having the two transistors (34) and (36) connected into a Darlington configuration. In the Darlington transistor (40) the two emitter junctions (70) and (72) are electrically serially connected. Thus a voltage required for a diffusion current to flow from the emitter to the base (which voltage is required to be equal to or higher than a diffusion potential) is increased to approximately twice. Therefore upon reaching its predetermined temperature, the thermally sensitive thyristor (42) is certainly conducting with the result that a base current to the Darlington transistor (40) is almost bypassed to the side of the second emitter electrode (32) by means of the thermally sensitive thyristor (42) with a very small proportion thereof flowing through each of the emitter junctions (70) and (72). This ensures that the Darlington transistor (40) is protected.

That is, if a voltage required for the diffusion current to flow from said emitter to the base is low then the thermally sensitive thyristor (42) cannot be made to conduct. Alternatively, it becomes difficult to sufficiently bypass the base current through the transistor to the side of the emitter electrode even though the thermally sensitive element would be conducting. However, according to the embodiment as above described, such an objection is eliminated.

As the thermally sensitive thyristor (42) is, of course, provided with the N gate electrode (62), the adjustment of the temperature at which switching the OFF state to the ON state is effected can be also accomplished as by a method of connecting a resistor across this N gate electrode (62) and the anode electrode (60).

Although the embodiment as above described has been constructed such that the cathode electrode (58) of the thermally sensitive thyristor (42) is thermally and electrically coupled to the emitter electrode (32) of the output transistor (36), the anode electrode (60) of the thermally sensitive thyristor (42) may be thermally and electrically coupled to the base electrode (26) of the driving transistor (34) and the cathode electrode (60) may be connected to the emitter electrode (32) of the output transistor (36) through an electrical lead. Alternatively the thermally sensitive thyristor (42) may be disposed on a supporting plate (not shown) having the collector electrode (24) fixed thereto, through a good thermally conductive insulation and the connection is effected as shown in FIG. 3.

Also as to the Darlington transistor (40), not only the NPN type but also the PNP type is applicable to the present invention and as to the thermally sensitive thyristor (42), it is also possible to use the respective regions (44), (46), (48) and (50) in said embodiment with the opposite type conductivity. In such case, the structure and circuit is the same as that shown in FIGS. 1, 2 and 3 with the type of conductivity of the respective regions being opposite from that shown in the figures.

Further even with the Darlington transistor (40) integrated on a single semiconductor substrate with other circuit elements, the protection from overheating and overcurrents can be effected by connecting the thermally sensitive thyristor (42) as in the embodiment as above described.

Still further, while the embodiment as above described has been illustrated as using the Darlington transistor (40) of monolithic structure, a plurality of single transistors may be used to form a Darlington configuration circuit. In that case the protective operation against overheating and overcurrents as above described can be performed by providing a thermally sensitive thyristor (42) so as to be thermally intimately coupled to at least a transistor on the output side and electrically connecting said thermally sensitive thyristor (42) between the base terminal (76) and the emitter terminal (78) of said Darlington configuration circuit.

As above described and according to the present invention, a semiconductor thermally sensitive switching element having at least a PNPN four layer structure is used as a thermally sensitive element while being electrically connected in a Darlington configuration circuit consisting of a plurality of transistors and between a base terminal and an emitter terminal thereof, the semiconductor thermally sensitive switching element sensing a temperature of at least said output transistor among said plurality of transistors to reach a predetermined temperature whereupon it suddenly changes from its high impedance state to its low impedance state. Upon the temperature of said output transistor reaching at least its permissible junction temperature said semiconductor thermally sensitive switching element has been adapted to be conducting. Therefore even if the temperature of the transistor is sufficiently less than its permissible junction temperature, its current amplification factor does not decrease and also the temperature of the transistor can be prevented from rising beyond its permissible junction temperature.

Also since said semiconductor thermally sensitive switching element is of a material similar to that of the transistor and structurally resembles the latter, it can be easily attached to the transistor and accordingly it can be provided in a selected place where a raise in temperature will first occur. Thus the thermal protection against overheating and overcurrents response can be effected.

What we claim is:

1. A Darlington circuit comprising a first transistor, a second transistor and a thermally sensitive four region semiconductor switching device, said thermally sensitive four region switching device being connected electrically in a series circuit relationship between base and emitter regions of the first and second transistors respectively and said thermally sensitive four region switching device being in physical and thermal contact with a predetermined portion of one of said transistors.

2. The Darlington circuit of claim 1 in which the thermally sensitive four region semiconductor switching device is in physical and thermal contact with a predetermined portion of said first transistor.

3. The Darlington circuit of claim 1 in which the thermally sensitive four region semiconductor switching device is in physical and thermal contact with a predetermined portion of said second transistor.

4. The Darlington circuit of claim 2 in which the physical and thermal contact between the thermally sensitive four region semiconductor switching device and the first transistor is effected by having the anode electrode of the switching device in physical contact with the base electrode of the first transistor.

5. The Darlington circuit of claim 3 in which the physical and thermal contact between the thermally sensitive four region semiconductor switching device and the second transistor is effected by having the cathode electrode of the switching device in physical contact with the emitter electrode of the second transistor.

6. The Darlington circuit of claim 1 in which the first and second transistors are contained within a single body of semiconductor material.

7. The Darlington circuit of claim 1 in which the semiconductor material is silicon.

8. A semiconductor device with a thermal protective device comprising: a plurality of transistors forming a Darlington configuration circuit and a semiconductor thermally sensitive switching element having a PNPN four layer structure, said switching element constituting said thermal protective device, said switching element being electrically connected between a base terminal and an emitter terminal of said Darlington configuration circuit while being thermally and physically coupled to at least an output transistor of said plurality of transistors, said switching element being changed from its high impedance state to its low impedance state when the switching element senses a temperature change in said output transistor toward a predetermined temperature, said semiconductor thermally sensitive switching element being adapted to be conducting upon the temperature of said output transistor reaching its permissible junction temperature.

9. A semiconductor device comprising: at least a first and a second transistor within a single body of semiconductor material, each of said first and second transistors having an independent emitter region and an independent base region and a common collector region, the base region of said first transistor being electrically connected to the emitter region of said second transistor and the emitter region of said first transistor being electrically connected to the base region of said second transistor, and a semiconductor thermally sensitive switching device, said switching device comprising at least four regions of alternate type semiconductivity, said switching device being electrically connected in a series circuit relationship between the base region of said first transistor and the emitter region of said second transistor, said switching device being thermally and physically connected to said second transistor, said switching device changing from a high impedance state to a low impedance state when sensing said second transistor reaching a predetermined temperature, said switching device being adapted to be conducting when said second transistor reaches its junction temperature.

* * * * *